(12) United States Patent
Lin et al.

(10) Patent No.: US 12,374,395 B2
(45) Date of Patent: Jul. 29, 2025

(54) RESISTIVE MEMORY APPARATUS AND OPERATING METHOD THEREOF AND MEMORY CELL ARRAY THEREOF

(71) Applicant: Winbond Electronics Corp., Taichung (TW)

(72) Inventors: Ming-Che Lin, Taichung (TW); Min-Chih Wei, Taichung (TW); Ping-Kun Wang, Taichung (TW); Yu-Ting Chen, Taichung (TW); Chih-Cheng Fu, Taichung (TW); Chang-Tsung Pai, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 18/399,609

(22) Filed: Dec. 28, 2023

(65) Prior Publication Data

US 2024/0135990 A1 Apr. 25, 2024
US 2024/0233819 A9 Jul. 11, 2024

Related U.S. Application Data

(62) Division of application No. 17/458,559, filed on Aug. 27, 2021, now Pat. No. 11,908,516.

(30) Foreign Application Priority Data

Aug. 27, 2020 (TW) ................ 109129312

(51) Int. Cl.
*G11C 11/00* (2006.01)
*G11C 13/00* (2006.01)

(52) U.S. Cl.
CPC ...... *G11C 13/0038* (2013.01); *G11C 13/0026* (2013.01); *G11C 13/0028* (2013.01); *G11C 13/004* (2013.01); *G11C 2213/79* (2013.01)

(58) Field of Classification Search
CPC ............ G11C 13/0038; G11C 13/0026; G11C 13/0028; G11C 13/004; G11C 2213/79;
(Continued)

(56) References Cited

U.S. PATENT DOCUMENTS

| | | | |
|---|---|---|---|
| 2013/0221315 A1* | 8/2013 | Wang | H10N 70/801 257/4 |
| 2014/0177315 A1* | 6/2014 | Pramanik | G11C 13/004 365/148 |
| 2021/0043246 A1* | 2/2021 | Lee | G11C 11/4082 |

FOREIGN PATENT DOCUMENTS

| | | |
|---|---|---|
| CN | 105280811 | 1/2016 |
| CN | 111223508 | 6/2020 |

OTHER PUBLICATIONS

"Office Action of China Counterpart Application", issued on May 29, 2024, p. 1-p. 8.

* cited by examiner

*Primary Examiner* — Hien N Nguyen
(74) *Attorney, Agent, or Firm* — JCIPRNET

(57) ABSTRACT

A resistive memory apparatus including a memory cell array, at least one dummy transistor and a control circuit is provided. The memory cell array includes a plurality of memory cells. Each of the memory cells includes a resistive switching element. The dummy transistor is electrically isolated from the resistive switching element. The control circuit is coupled to the memory cell array and the dummy transistor. The control circuit is configured to provide a first bit line voltage, a source line voltage and a word line voltage to the dummy transistor to drive the dummy transistor to output a saturation current. The control circuit is further configured to determine a value of a second bit line voltage for driving the memory cells according to the saturation (Continued)

current. In addition, an operating method and a memory cell array of the resistive memory apparatus are also provided.

20 Claims, 7 Drawing Sheets

(58) Field of Classification Search
CPC .......... G11C 2013/0083; G11C 13/003; G11C 13/0064; G11C 13/0069; G11C 2213/51; G11C 2213/56; G11C 7/12; G11C 7/14; G11C 2213/82
See application file for complete search history.

RESISTIVE MEMORY APPARATUS AND OPERATING METHOD THEREOF AND MEMORY CELL ARRAY THEREOF

CROSS-REFERENCE TO RELATED APPLICATION

This application is a divisional application of and claims the priority benefit of U.S. application Ser. No. 17/458,559, filed on Aug. 27, 2021. The prior application Ser. No. 17/458,559 claims the priority benefit of Taiwan application no. 109129312, filed on Aug. 27, 2020. The entirety of each of the above-mentioned patent applications is hereby incorporated by reference herein and made a part of this specification.

TECHNICAL FIELD

The invention relates to a memory apparatus and an operating method of the memory apparatus, and more particularly to a resistive memory apparatus, an operating method of the resistive memory apparatus and a memory cell array thereof.

BACKGROUND

The memory cell of the current resistive random access memory (RRAM) usually includes a resistive switching element and a transistor. The resistive switching element includes a top electrode and a bottom electrode disposed opposite to each other, and a resistive switching layer located between the top electrode and the bottom electrode. The transistor has a gate connected to a word line, a source connected to a source line, and a drain connected to a first end of the resistive switching element. Before the resistive switching element can be repeatedly switched between high and low resistance states for storing data, a channel forming procedure needs to be performed. The forming procedure includes providing a bias (e.g., a positive bias) to the resistive switching element by the transistor so that current flows from the top electrode to the bottom electrode, oxygen vacancy and oxygen ions are generated in the resistive switching layer to form a current path, and the resistive switching element is changed from the high resistance state (HRS) to the low resistance state (LRS) to form a conductive filament. Normally, in the formed filament, a diameter of a portion near the top electrode is smaller than a diameter of a portion near the bottom electrode. Afterwards, setting or resetting may be performed on the RRAM so the resistive switching element can switch between HRS and LRS to complete the process of storing data. In addition, when resetting is performed on the current RRAM, a reverse bias with opposite polarity to setting is provided to the resistive switching element by the transistor so that current flows from the bottom electrode to the top electrode. At this time, oxygen vacancy is combined with some of oxygen ions at the portion near the top electrode to interrupt the current path so that the filament is cut off at the portion near the top electrode. When setting is performed on the current RRAM, a bias with the same polarity in the forming procedure is provided to the resistive switching element by the transistor so that current flows from the top electrode to the bottom electrode. At this time, oxygen ions at the portion adjacent to the top electrode are released such that the filament is re-formed at the portion adjacent to the top electrode.

In general, a driving capability of the transistor will affect a current read from the memory cell (abbr.: a cell current). However, before the filament is formed, it is impossible to learn of the driving capability of the transistor in each memory cell. Accordingly, a bit line voltage required for the resistive switching element to be written to a specific resistance state cannot be accurately provided. Consequently, the current RRAM needs to adjust the bit line voltage many times during the forming procedure and each write operation (including reset and set) to ensure that the RRAM is written to the specific resistance state. Further, the bit line voltage needs to be readjusted in each write operation, thereby reducing an operating speed. In addition, because the transistors in the memory array often have process variations, the driving capabilities of these transistors are not consistent. Therefore, it is necessary to configure additional circuits in the conventional RRAM to avoid the problem of excessive variation on the cell current under the same operation, thereby resulting in being not conducive to the miniaturization of RRAM.

SUMMARY

The invention provides a resistive memory apparatus, an operating method of the resistive memory apparatus and a memory cell array thereof to solve the problems of low operating speed and being not conducive to miniaturization mentioned above.

The resistive memory apparatus of the invention includes a memory cell array, a dummy transistor and a control circuit. The memory cell array includes a plurality of memory cells. Each of the memory cells includes a resistive switching element. The dummy transistor is electrically isolated from a resistive switching element of the memory cell. The control circuit is coupled to the memory cell array and the dummy transistor. The control circuit is configured to provide a first bit line voltage, a source line voltage and a word line voltage to the dummy transistor to drive the dummy transistor to output a saturation current. The control circuit is further configured to determine a value of a second bit line voltage for driving the memory cells according to the saturation current.

The operating method of the resistive memory apparatus of the invention includes: providing a first bit line voltage, a source line voltage and a word line voltage to the dummy transistor to determine a value of a saturation current of the at least one dummy transistor; determining a value of a second bit line voltage provided to the memory cells according to the value of the saturation current; and driving the memory cells according to the determined second bit line voltage so that a cell current of the memory cells is greater than a target current value.

The memory cell array of the resistive memory apparatus of the invention includes a plurality of memory cells, and each of the memory cells includes a bottom electrode layer, a resistive switching layer and a top electrode layer. The resistive switching layer is disposed on the bottom electrode layer, and includes a plurality of regions with different conduction conditions. The top electrode layer is disposed on the resistive switching layer, and configured to receive a bit line voltage.

In the embodiments of the invention, the control circuit can learn of the characteristics of a transistor element to be electrically connected to the memory cell through the dummy transistor that is not electrically connected to the memory cell, so as to accurately apply the bit line voltage to the memory cells to increase the operating speed. Furthermore, in an embodiment of the invention, the memory cell array of the resistive memory apparatus may be composed of multiple resistive switching elements. Compared with the memory cell array of the current RRAM that needs to configure a plurality of transistors connected in series with the resistive switching elements, the embodiment of the invention is beneficial to miniaturization of the resistive memory apparatus.

To make the aforementioned more comprehensible, several embodiments accompanied with drawings are described in detail as follows.

DETAILED DESCRIPTION

Figure 1:
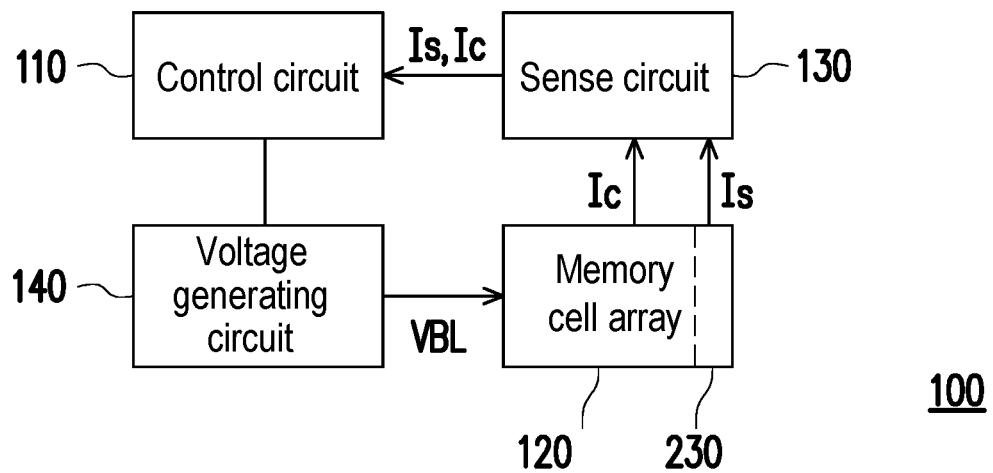
FIG. 1 illustrates a schematic diagram of a RRAM in an embodiment of the invention.
Figure 2:
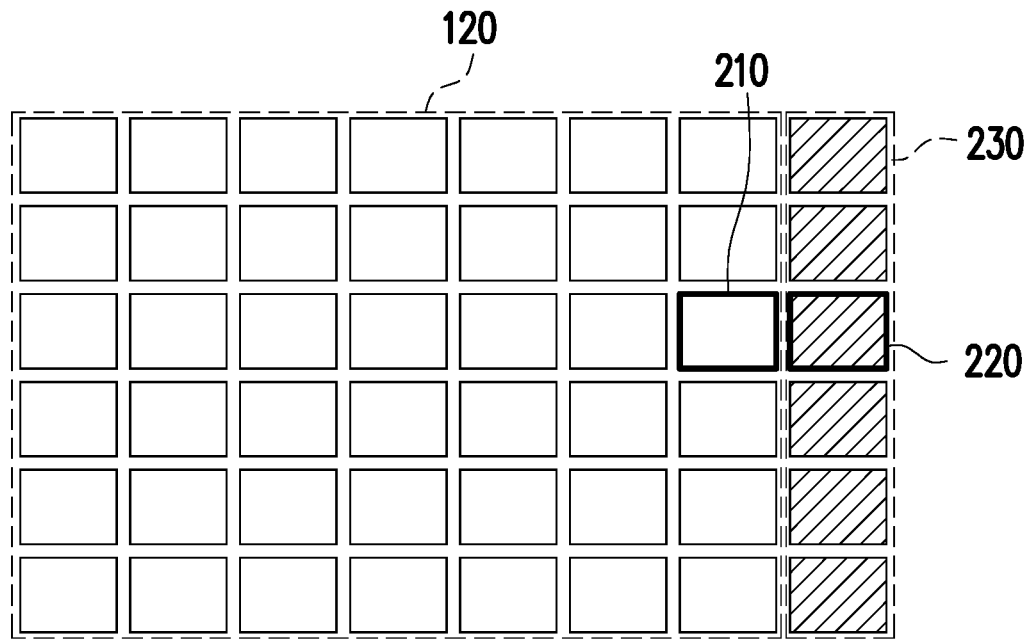
FIG. 2 illustrates a schematic diagram of a memory cell array and a dummy transistor column in the embodiment of FIG. 1.
Figure 3:
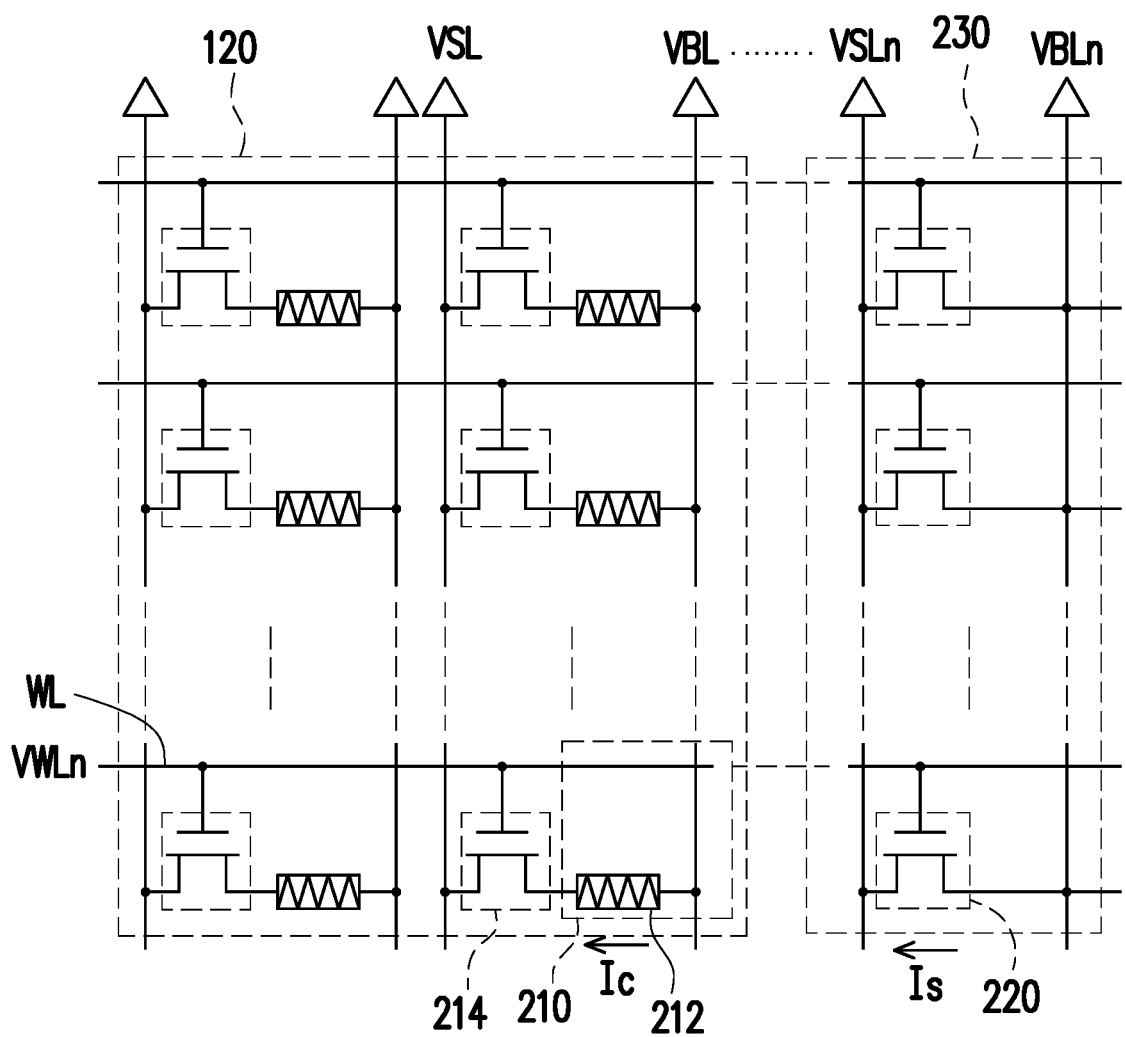
FIG. 3 illustrates a schematic diagram of an internal structure of the memory cell and the dummy transistor in the embodiment of FIG. 2.

Referring to FIG. 1 to FIG. 3, a RRAM 100 of this embodiment includes a control circuit 110, a memory cell array 120, a dummy transistor 220, a sense circuit 130 and a voltage generating circuit 140. The control circuit 110 is coupled to the memory cell array 120 and the dummy transistor 220. The sense circuit 130 and the voltage generating circuit 140 are coupled to the control circuit 110 and the memory cell array 120. The memory cell array 120 is composed of a plurality of memory cells 210. The dummy transistor 220 is electrically isolated from a resistive switching element of the memory cell 210. The number of the dummy transistors 220 is smaller than the number of the memory cells 210. In this embodiment, the RRAM 100 includes a plurality of the dummy transistors 220, and the dummy transistors 220 are arranged in a column to form a dummy transistor column 230. The dummy transistor column 230 may be adjacently disposed on an outer side of the memory cell array 120 and arranged in an array with the memory cells 210. However, the number and positions of dummy transistors are not limited thereto. In another embodiment, the RRAM 100 has only one dummy transistor 220. In yet another embodiment, the dummy transistors 220 are arranged in a plurality of columns and a plurality of rows to form a dummy transistor array. In an embodiment, it is also possible that the dummy transistors 220 are not adjacently disposed with the memory cells 210 and not arranged in an array with the memory cells 210.

In this embodiment, the memory cell 210 is composed of a resistive switching element 212, and sufficient teaching, suggestion, and implementation description for its implementation manner can be obtained based on common knowledge in the technical field. Two ends of the memory cell 210 are respectively coupled to a bit line voltage (a second bit line voltage) VBL and a source line voltage VSL. In this embodiment, the memory cell 210 is coupled to the source line voltage VSL through an external transistor 214 coupled to a word line WL. The external transistor 214 is disposed outside the RRAM 100. In an embodiment, the source line voltage VSL is, for example, a ground voltage. Two ends of the dummy transistor 220 are respectively coupled to a bit line voltage (a first bit line voltage) VBLn and a source line voltage VSLn, and a gate of the dummy transistor 220 is coupled to a word line voltage VWLn. The dummy transistor 220 is configured to simulate the external transistor 214, and its process conditions or characteristics are the same as or similar to those of the external transistor 214. The control circuit 110 is configured to appropriately provide the bit line voltage VBLn, the source line voltage VSLn and the word line voltage VWLn to the dummy transistor 220 so that the dummy transistor 220 outputs a saturation current Is. The sense circuit 130 is configured to sense the saturation current Is of the dummy transistor 220 and provide the sensed saturation current Is to the control circuit 110. The control circuit 110 determines a value of the bit line voltage VBL for driving the memory cells 210 according to the saturation current Is, such that the memory cell 210 can be drove to output a cell current Ic. The sense circuit 130 is configured to sense the cell current Ic and provide the sensed cell current Ic to the control circuit 110 for verifying whether the forming procedure or the write operation is successful. In an embodiment, the control circuit 110 determines the bit line voltage VBL applied to the memory cell 210 according to a lookup table shown in Table 1 below. The lookup table may be stored through a plurality of control bits. For example, the bit line voltage VBL_1 corresponding to a saturation current interval ">800" may be stored in one option bit among the control bits, and the rest may be deduced by analogy.

TABLE 1

| Saturation current interval (μA/μm) | Bit line voltage (V) |
|---|---|
| >800 | VBL_1 |
| 600~800 | VBL_2 |
| 400~600 | VBL_3 |
| 200~400 | VBL_4 |

Table 1 lists a relationship between the saturation current intervals and the bit line voltages VBL. In Table 1, bit line voltage VBL_4> bit line voltage VBL_3> bit line voltage VBL_2> bit line voltage VBL_1. Specifically, the control circuit 110 determines which one of the saturation current intervals exemplified in Table 1 the saturation current Is of the dummy transistor 220 falls in, so as to correspondingly find the bit line voltage VBL required for driving the memory cells 210. For instance, the control circuit 110 determines that the saturation current Is falls in the maximum saturation current interval ">800", it indicates that the driving capability of the dummy transistor 220 is relatively strong. Correspondingly, when the external transistor 214 configured to drive the memory cell 210 is similar to the dummy transistor 220 described above, by reading the saturation current Is of the dummy transistor 220, it can be predicted that the number of filament paths need to be turned on when completing the forming procedure or setting of the memory cell 210 is smaller. Therefore, when the memory cell 210 is driven by the external transistor similar to the dummy transistor 220 during the forming procedure or the write operation, an initial bit line voltage applied to the memory cells 210 is set to VBL_1. Conversely, if the control circuit 110 determines that the saturation current Is of the dummy transistor 220 falls in the minimum current interval "200~400", it indicates that the driving capability of the dummy transistor 220 is relatively weak. Correspondingly, when the external transistor configured to drive the memory cell 210 is similar to the dummy transistor 220 described above, by reading the saturation current Is of the dummy transistor 220, it can be predicted that the number of filament paths need to be turned on when completing the forming procedure or setting of the memory cell 210 is larger. Therefore, when the memory cell 210 is driven by the external transistor similar to the dummy transistor 220 during the forming procedure or the write operation, the initial bit line voltage applied to the memory cells 210 is set to VBL_4. In this way, the present embodiment can dynamically adjust the initial bit line voltage according to the saturation current Is read from the dummy transistor 220, so that the write operation of the memory cells 210 may be performed efficiently (e.g., setting the memory cells 210 so that the cell current Ic is greater than a preset target current value (e.g., 30 μA)), and power consumption may be reduced. In addition, through the resistive switching layer provided by this embodiment, the dynamically adjusted initial bit line voltage may change the number of the filament paths to be turned on, and the driving limitation provided by the saturation current of the transistor may be overcome. The specific content and manufacturing method of the resistive switching layer of this embodiment will be described in detail later.

In this embodiment, the voltage generating circuit 140 is configured to generate the bit line voltage VBL and other voltages required for operating the memory cell array 120 and the dummy transistor 220. As recorded in Table 1 above, when the saturation current Is output by the dummy transistor 220 is larger, the initial bit line voltage VBL is smaller. However, the values exemplified in Table 1 above are not intended to limit the invention, and the lookup table is not limited to the form of Table 1.

In this embodiment, the control circuit 110 may be a processor with computing capability. Alternatively, the control circuit 110 may be a hardware circuit designed through Hardware Description Language (HDL) or any other design methods for digital circuit well-known to persons with ordinary skill in the art and may be implemented in from of Field Programmable Gate Array (FPGA), Complex Programmable Logic Device (CPLD) or Application-specific Integrated Circuit (ASIC).

In another embodiment not shown, the memory cell 210 has a structure of a transistor element and a resistive switching element (1T1R) connected in series, wherein the transistor element is the same as the dummy transistor 220. The word line voltage VWLn is provided to the transistor element in the memory cell 210 through the word line WL, and the resistive switching element is coupled to the source line voltage VSL through the transistor element. The transistor elements and the dummy transistors 220 in the memory cells 210 located in the same row are respectively coupled to the same word line WL. However, when the dummy transistor 220 is not arranged in an array with the memory cell 210, the transistor element in the memory cell 210 and the dummy transistor 220 are coupled to different word lines WL.

In this embodiment, the circuit structure of the sensing circuit 130 and the voltage generating circuit 140 and sufficient teachings, suggestions and implementation descriptions for their implementation manners can be obtained based on common knowledge in the technical field.

Figure 4:
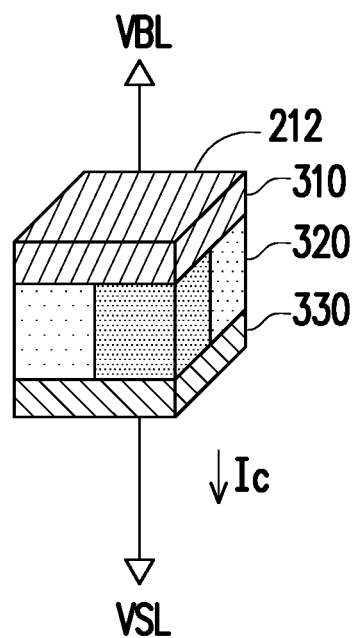
FIG. 4 illustrates a schematic diagram of a resistive switching element according to an embodiment of the invention.
Figure 5:
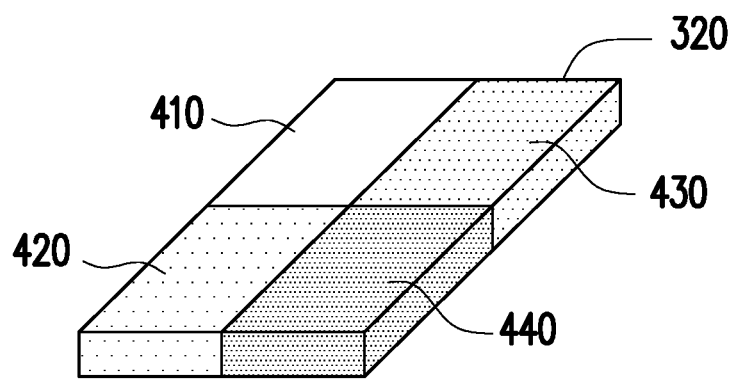
FIG. 5 illustrates a schematic diagram of a conductive region of a resistive switching layer in the embodiment of FIG. 4.

Referring to FIG. 4 and FIG. 5, the resistive switching element 212 of this embodiment includes a top electrode layer 310, a resistive switching layer 320 and a bottom electrode layer 330. The resistive switching layer 320 is disposed between the top electrode layer 310 and the bottom electrode layer 330. The top electrode layer 310 is coupled to the bit line voltage VBL. The bottom electrode layer 330 is coupled to the source line voltage VSL. The resistive switching layer 320 may include a plurality of regions with different conduction conditions. In this embodiment, the resistive switching layer 320 includes a plurality of regions 410, 420, 430 and 440 with different doping concentrations, in which a doping element may be ions of oxygen, hydrogen, nitrogen, argon or aluminum. The resistive switching element 212 may further include a barrier layer and an oxygen ion reservoir layer, and the invention is not limited to those illustrated in FIG. 4. The material of the barrier layer may include aluminum oxide ($Ai_xO_y$), titanium oxide ($Ti_xO_y$), tantalum oxide ($Ta_xO_y$), hafnium oxide ($Hf_xO_y$), nickel oxide ($Ni_xO_y$), zirconium oxide ($Zr_xO_y$) or a combination thereof. In some embodiments, the material of the barrier layer is aluminum oxide. The oxygen ion reservoir layer can be used to store oxygen ions from the resistive switching layer 320. The material of the oxygen ion reservoir layer may include titanium (Ti), tantalum (Ta), hafnium (Hf) and zirconium (Zr). In some embodiments, the material of the oxygen ion reservoir layer is titanium. In an embodiment not shown, the resistive switching element includes a first barrier layer and a second barrier layer. The first barrier layer is, for example, disposed on the resistive switching layer and configured to prevent oxygen ion diffusion. The oxygen ion reservoir layer is, for example, disposed on the first barrier layer. The second barrier layer is, for example, disposed on the oxygen ion reservoir layer. The top electrode layer is, for example, disposed on the second barrier layer.

The top electrode layer 310 and the bottom electrode layer 330 are made of good conductors, and their materials may be the same or different. The material of the top electrode layer 310 and the bottom electrode layer 330 may include titanium, tantalum, titanium nitride, tantalum nitride, other suitable conductive materials or a combination thereof. The material of the resistive switching layer 320 includes, for example, a transition metal oxide (TMO). Different voltages are applied to the top electrode layer 310 and the bottom electrode layer 330 to change the resistance states of the resistive switching element 212 to provide the function of storing data. That is, the memory cell 210 has at least two resistance states.

The operation of the control circuit 110 to drive the memory cell 210 may include, but is not limited to, a forming procedure, a resetting operation, and a setting operation. In this embodiment, the control circuit 110 can perform the forming procedure on the memory cell 210. In this procedure, a bias (i.e., a forming voltage) is constantly applied to electrodes at both sides of the memory cell 210 to generate an applied electric field on the resistive switching layer 320. For example, according to Table 1, the control circuit 110 can determine the value of the bit line voltage VBL applied to the top electrode layer 310. The applied electric field separates the oxygen atoms in the resistive switching layer 320 into oxygen ions and oxygen vacancy. The oxygen vacancy forms a filament in the resistive switching layer 320 as a current transmission path. When the applied electric field exceeds a threshold, dielectric breakdown will occur in the resistive switching layer 320, thereby changing the resistance from the high resistance state to the low resistance state. This breakdown is not permanent, and the resistance can still be changed. In this embodiment, since the resistive switching layer 320 includes the four regions 410, 420, 430 and 440 with the different doping concentrations, the conduction conditions of these regions are different. Therefore, according to the value of the bit line voltage VBL applied to the top electrode layer 310, the number of conductive channels formed can be determined. In an embodiment, the doping concentration of the region 440 is greater than the doping concentration of the region 430; the doping concentration of the region 430 is greater than the doping concentration of the region 420; and the doping concentration of the region 420 is greater than the doping concentration of the region 410. In addition, the bit line voltage VBL_1 can drive the region 440 to be turned on; the bit line voltage VBL_2 can drive the regions 430 and 440 to be turned on; the bit line voltage VBL_3 can drive the regions 420, 430 and 440 to be turned on; and the bit line voltage VBL_4 can drive the regions 410, 420, 430 and 440 to be turned on.

Figure 6A:
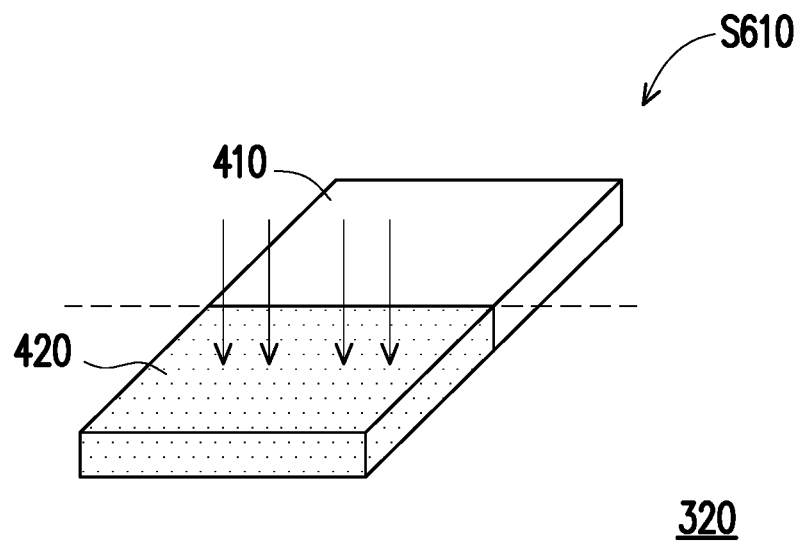
FIG. 6A and FIG. 6B illustrate a flowchart for manufacturing the resistive switching layer according to an embodiment of the invention.
Figure 6B:
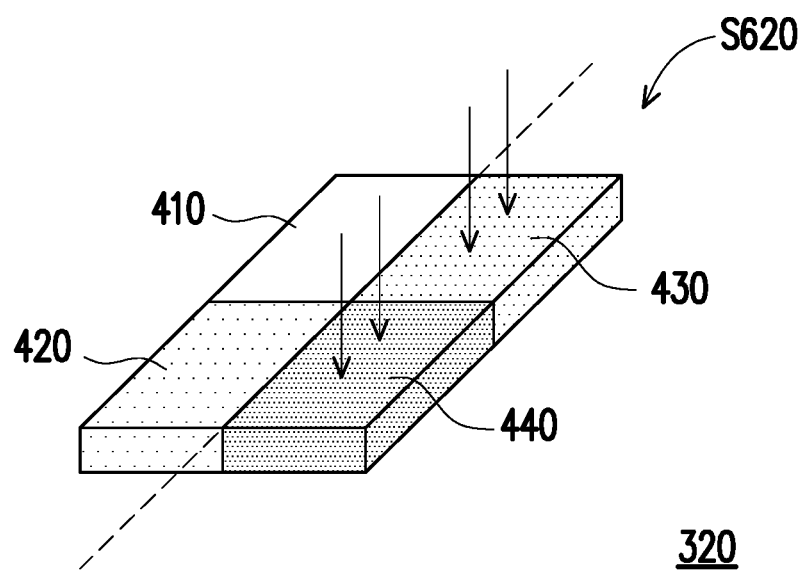

Referring to FIG. 6A and FIG. 6B, in this embodiment, for example, an ion implantation process is performed on the resistive switching layer 320, so that the resistive switching layer 320 has the regions 410, 420, 430 and 440 with the different doping concentrations. In the ion implantation process, it is possible to use only one or two masks to form the regions 410, 420, 430 and 440. In step S610, the region 410 is masked by a first mask, and a first ion implantation process is performed on the region 420. In step S620, the regions 410 and 420 are masked by a second mask or the first mask rotated 90 degrees, and a second ion implantation process is performed on the regions 430 and 440. Accordingly, the doping concentrations of the regions 410, 420, 430 and 440 are different.

Figure 7:
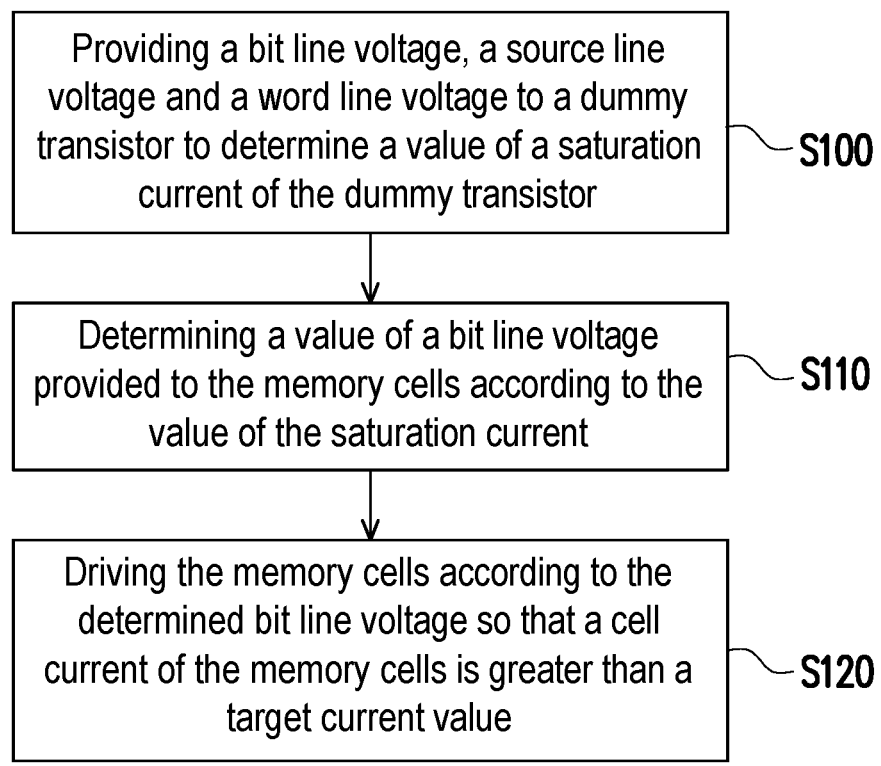
FIG. 7 and FIG. 8 illustrate flowcharts of operating methods of a RRAM in some embodiments of the invention.

Referring to FIG. 1 and FIG. 7, the operating method of the RRAM of this embodiment is at least applicable to the RRAM 100 of FIG. 1, but the invention is not limited thereto. In step S100, the control circuit 110 appropriately provides a bit line voltage, a source line voltage and a word line voltage to the dummy transistor 220 to determine a value of the saturation current Is of the dummy transistor 220. In step S110, the control circuit 110 determines a value of the bit line voltage VBL for driving the memory cells 210 according to the value of the saturation current Is. For example, the control circuit 110 determines the value of the bit line voltage VBL provided to the memory cells 210 according to the lookup table shown in Table 1, and controls the voltage generating circuit 140 to generate and output the bit line voltage VBL to the memory cell array 120 according to the determined value of the bit line voltage VBL. Next, in step S120, the control circuit 110 drives the memory cells 210 according to the determined bit line voltage VBL so that the cell current Ic of the memory cells 210 is greater than a target current value.

In addition, the specific details of the operating method of the RRAM of the embodiment of the invention can be obtained from the description of the embodiment in FIG. 1 to FIG. 6B with sufficient teaching, suggestion and implementation description.

Figure 8:
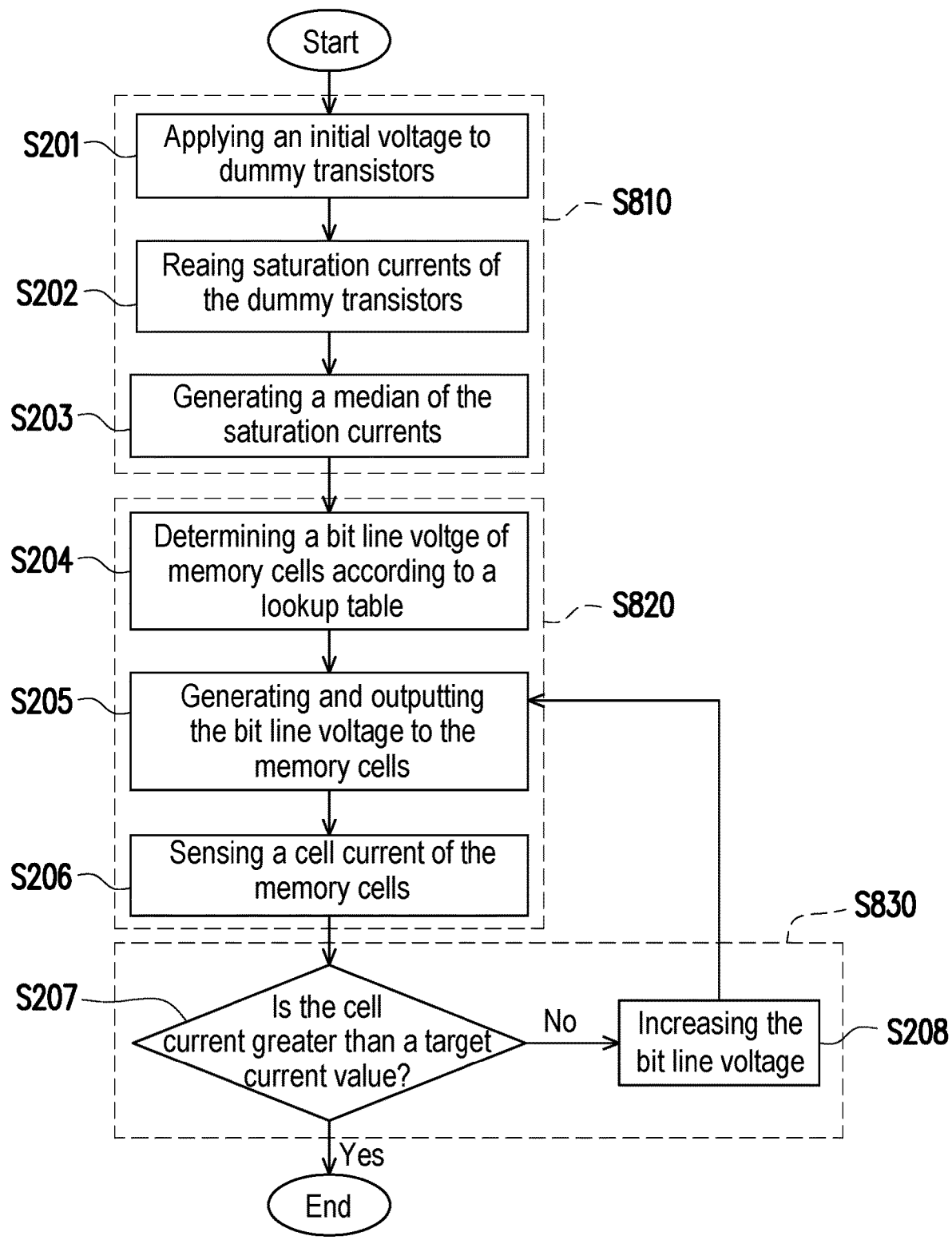

FIG. 8 illustrates a flowchart of an operating method of a RRAM in another embodiment of the invention. Referring to FIG. 1, FIG. 5 and FIG. 8, the operating method of this embodiment can be roughly divided into three stages, such as a detection stage S810, a decision stage S820 and an activation stage S830. The above three stages are only for illustration and not to limit the invention. In the detection stage S810, the control circuit 110 can detect or test a performance of the dummy transistor 220 (e.g., detect the value of the saturation current Is of the dummy transistor 220) to generate a detection result. In the decision stage S820, the control circuit 110 determines how many regions of the resistive switching element 212 need to be turned on or off to make the cell current Ic of the memory cell 210 greater or smaller than the target current value according to the detection result and the lookup table shown in Table 1. In the activation stage S830, the control circuit 110 ensures the number of the regions turned on can make the cell current Ic of the memory cells 210 greater than the target current value.

Specifically, in step S201, the control circuit 110 applies an initial voltage to the dummy transistor column 230. The initial voltage includes the word line voltage, the bit line voltage and/or the source line voltage. In step S202, the sense circuit 130 reads a plurality of saturation currents Is of the dummy transistors 220 from the dummy transistor column 230. In step S203, the control circuit 110 determines and calculates the saturation current of each dummy transistor 220 to generate a median of the saturation currents Is of the dummy transistor column 230 as the detection result. In another embodiment, the control circuit 110 may calculate the saturation currents Is to obtain a mean or a majority of the saturation currents Is as the detection result. Then, in the decision stage S820, the control circuit 110 determines the bit line voltage VBL for driving the memory cells 210 according to the detection result and the lookup table.

In step S204, the control circuit 110 determines the bit line voltage VBL applied to the memory cells 210 during a forming operation according to the lookup table shown in Table 1. In step S205, the control circuit 110 controls the voltage generating circuit 140 to generate and output the bit line voltage VBL to the memory cells 210 according to the value of the bit line voltage VBL determined in step S204, so that the memory cells 210 output the cell current Ic. In step S206, the sense circuit 130 senses the cell current Ic and provides the cell current Ic to the control circuit 110.

Figure 9:
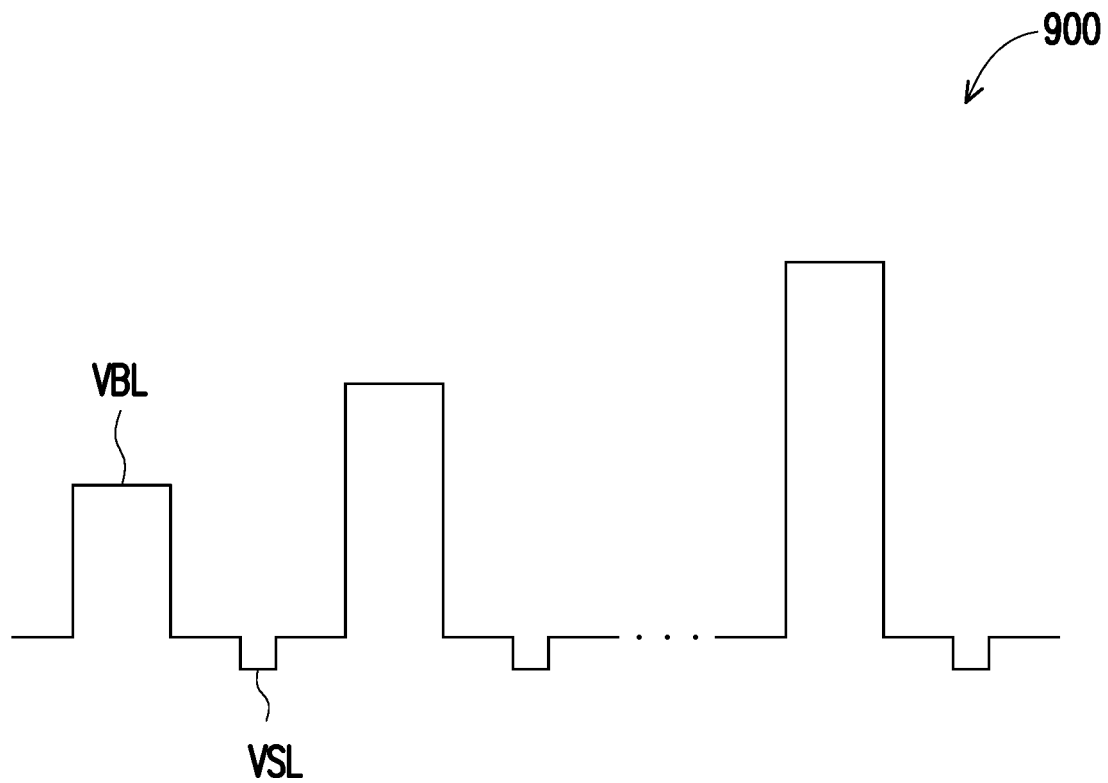
FIG. 9 illustrates a schematic waveform diagram of a ramp voltage in an embodiment of the invention.

Taking the forming operation as an example, in step S207, the control circuit 110 determines whether the read cell current Ic of the memory cell 210 is greater than the target current value. If "Yes", the operation ends. Otherwise, in step S208, the control circuit 110 increases the bit line voltage VBL by a predetermined value, and returns to step S205 to apply the increased bit line voltage VBL to the memory cells 210. As shown in FIG. 9, if the result of step S207 is "No", the next bit line voltage VBL will be greater than the previous bit line voltage VBL (i.e., a ramp voltage 900), and the waveform is only used for illustration and does not limit the invention. Here, the source line voltage VSL is also included between square waves of the bit line voltage VBL, and a level of the source line voltage VSL does not change with the number of applications. In the ramp voltage 900, an initial level of the bit line voltage VBL can be determined according to Table 1. The control circuit 110 repeatedly executes steps S205 to S208 until the cell current Ic is greater than the target current value. Therefore, in the activation stage S830, the control circuit 110 can ensure that the formed one or more conductive channels can make the cell current Ic of the memory cells 210 greater than the target current value.

In an embodiment, the control circuit 110 further includes an auto-stop circuit of the ramp voltage, which is configured to determine whether the increased cell current Ic is greater than an auto-stop threshold. If so, a write termination result is output. Otherwise, the bit line voltage is increased continuously until the cell current reaches the auto-stop threshold.

In summary, in the embodiment of the invention, when the memory cells are driven by the transistor similar to the dummy transistor during the forming procedure or the write operation, the control circuit can detect or test a component performance of the dummy transistor, and determine the value of the bit line voltage for driving the memory cells according to the detection result and the lookup table, so that the cell current of the memory cells is greater than the target current value. As a result, the control circuit can learn of the characteristics of the transistor used to drive the memory cells, and can thus accurately apply the bit line voltage to the memory cells to increase the operating speed of the memory cells and reduce power consumption. On the other hand, the driving limitation provided by the saturation current of the transistor is also overcome.

Although the present invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

The invention claimed is:

1. An operating method of a resistive memory apparatus, wherein the resistive memory apparatus comprises a memory cell array and at least one dummy transistor, the memory cell array comprises a plurality of memory cells, each of the memory cells comprises a resistive switching element, and the operating method comprises:
providing a first bit line voltage, a source line voltage and a word line voltage to the at least one dummy transistor to determine a value of a saturation current of the at least one dummy transistor, wherein the at least one dummy transistor is electrically isolated from the resistive switching element;
determining a value of a second bit line voltage provided to the memory cells according to the value of the saturation current; and
driving the memory cells according to a determined bit line voltage so that a cell current of the memory cells is greater than a target current value,
wherein the resistive switching element in each of the memory cells comprises:
a bottom electrode layer;
a resistive switching layer, disposed on the bottom electrode layer, and comprising a plurality of regions with different conduction conditions arranged in a direction different from a thickness direction of the resistive switching layer; and
a top electrode layer, disposed on the resistive switching layer, and configured to receive the determined bit line voltage.

2. The operating method of the resistive memory apparatus of claim 1, wherein the step of determining the value of the second bit line voltage provided to the memory cells according to the value of the saturation current comprises:
determining the value of the second bit line voltage according a lookup table; and
generating and outputting the second bit line voltage according to the determined value of the second bit line voltage.

3. The operating method of the resistive memory apparatus of claim 2, wherein the lookup table comprises a plurality of saturation current intervals and a relationship of the second bit line voltage corresponding to each of the saturation current intervals.

4. The operating method of the resistive memory apparatus of claim 1, wherein the second bit line voltage is configured to drive at least one of the regions with the different conduction conditions to be turned on.

5. The operating method of the resistive memory apparatus of claim 4, wherein the second bit line voltage decreases as the saturation current increases.

6. The operating method of the resistive memory apparatus of claim 4, wherein the regions with the different conduction conditions have different doping concentrations.

7. The operating method of the resistive memory apparatus of claim 1, further comprising:
determining which one of the plurality of saturation current intervals the saturation current of the at least one dummy transistor is in; and
driving the memory cells according to the second bit line voltage corresponding to the saturation current interval.

8. The operating method of the resistive memory apparatus of claim 1, wherein the resistive switching element further comprises a first barrier layer, an oxygen ion reservoir layer, and a second barrier layer, the resistive switching layer is disposed between the first barrier layer and the bottom electrode layer, the oxygen ion reservoir layer is disposed on the first barrier layer, and the top electrode layer is disposed on the second barrier layer.

9. The operating method of the resistive memory apparatus of claim 1, further comprising:
sensing the saturation current of the at least one dummy transistor and outputting the saturation current.

10. The operating method of the resistive memory apparatus of claim 9, further comprising:
generating and outputting the second bit line voltage to the memory cell array.

11. A memory cell array of a resistive memory apparatus comprising a plurality of memory cells, each of the memory cells comprising:
a bottom electrode layer;
a resistive switching layer, disposed on the bottom electrode layer, and comprising a plurality of regions with different conduction conditions arranged in a direction different from a thickness direction of the resistive switching layer; and
a top electrode layer, disposed on the resistive switching layer, and configured to receive a bit line voltage, wherein at least one of the plurality of regions is turned on according to the bit line voltage.

12. The memory cell array of the resistive memory apparatus of claim 11, wherein the regions with the different conduction conditions have different doping concentrations.

13. The memory cell array of the resistive memory apparatus of claim 12, wherein a number of the regions with the different conduction conditions being turned on increases as the bit line voltage increases.

14. The memory cell array of the resistive memory apparatus of claim 13, wherein the doping concentrations of the regions with the different conduction conditions being turned on is greater as the bit line voltage decreases.

15. The memory cell array of the resistive memory apparatus of claim 11, wherein at least one ion implantation process is performed on the resistive switching layer, so that the resistive switching layer has the regions with the different conduction concentrations.

16. The memory cell array of the resistive memory apparatus of claim 15, wherein in the at least one the ion implantation process, one or two masks are used to form the regions.

17. The memory cell array of the resistive memory apparatus of claim 16, wherein the at least one the ion implantation process comprises a first ion implantation process and a second ion implantation process, the one or two masks comprise a first mask, and the regions comprise a first region, a second region, a third region, and a fourth region,
   wherein the first region is masked by the first mask, and the first ion implantation process is performed on the second region.

18. The memory cell array of the resistive memory apparatus of claim 17, wherein the first region and the second region are masked by the first mask rotated a specified angle.

19. The memory cell array of the resistive memory apparatus of claim 17, wherein the one or two masks further comprise a second mask, and the first region and the second region are masked by the second mask.

20. The memory cell array of the resistive memory apparatus of claim 17, wherein the second ion implantation process is performed on the third region and the fourth region.

\* \* \* \* \*